United States Patent
Park et al.

(10) Patent No.: US 12,148,617 B2
(45) Date of Patent: Nov. 19, 2024

(54) STRUCTURE AND METHOD TO PATTERN PITCH LINES

(71) Applicant: INTERNATIONAL BUSINESS MACHINES CORPORATION, Armonk, NY (US)

(72) Inventors: Chanro Park, Clifton Park, NY (US); Chi-Chun Liu, Altamont, NY (US); Stuart Sieg, Albany, NY (US); Yann Mignot, Slingerlands, NY (US); Koichi Motoyama, Clifton Park, NY (US); Hsueh-Chung Chen, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 401 days.

(21) Appl. No.: 17/453,010

(22) Filed: Nov. 1, 2021

(65) Prior Publication Data
US 2023/0138978 A1    May 4, 2023

(51) Int. Cl.
*H01L 21/033* (2006.01)
*H01L 21/3213* (2006.01)

(52) U.S. Cl.
CPC .... *H01L 21/0337* (2013.01); *H01L 21/32139* (2013.01); *H01L 21/0332* (2013.01)

(58) Field of Classification Search
CPC ................. H01L 21/32139; H01L 21/31144
See application file for complete search history.

(56) References Cited

U.S. PATENT DOCUMENTS

| | | |
|---|---|---|
| 8,835,323 B1 | 9/2014 | Shieh |
| 9,368,394 B1 | 6/2016 | Hung |
| 9,425,049 B2 | 8/2016 | Huang |
| 9,691,775 B1 | 6/2017 | Licausi |
| 10,770,295 B2 | 9/2020 | Lazzarino |
| 2015/0147882 A1 | 5/2015 | Yao |
| 2017/0140986 A1 | 5/2017 | Machkaoutsan |

(Continued)

OTHER PUBLICATIONS

Briggs et al., "N5 technology node dual-damascene interconnects enabled using multi patterning", International Interconnect Technology Conference (IITC), 2017 IEEE, 4 pp.

(Continued)

*Primary Examiner* — Walter H Swanson
(74) *Attorney, Agent, or Firm* — Samuel A. Waldbaum (57) ABSTRACT

A method of semiconductor manufacture comprising forming a plurality of first mandrels as the top layer of the multi-layered hard mask and forming a first spacer around each of the plurality of first mandrels. Removing the plurality of first mandrels and cutting the first spacer to form a plurality of second mandrels. Forming a second spacer around each of the plurality of second mandrels and forming a first self-aligned pattern that includes a plurality of third mandrels. Removing the plurality of second mandrels and the second spacer and etching the multi-layered hard mask to transfer the first-self aligned pattern to a lower layer of the multi-layered hard mask. Forming a second self-aligned pattern, wherein the second self-aligned pattern is intermixed with the first self-aligned pattern and etching the first self-aligned pattern and the second self-aligned pattern into the conductive metal layer.

11 Claims, 12 Drawing Sheets

(56) References Cited

U.S. PATENT DOCUMENTS

| | | |
|---|---|---|
| 2019/0157082 A1 | 5/2019 | Fan |
| 2019/0206725 A1 | 7/2019 | Chu |
| 2020/0111670 A1 | 4/2020 | Huang |
| 2020/0321215 A1 | 10/2020 | Fan |
| 2022/0068643 A1* | 3/2022 | Sahmuganathan ......................... H01L 21/0337 |

OTHER PUBLICATIONS

Drissi et al., "SALELE Process from Theory to Fabrication", Proc. of SPIE, vol. 10962, Jul. 25, 2019, pp. 109620V-1-109620V-12.
Chen, "SALELE Double Patterning for 7nm and 5nm Nodes", Advanced Memory Development at Winbond Electronics, Published Mach 24, 2021, 5 pages, https://www.linkedin.com/pulse/salele-double-patterning-7nm-5nm-nodes-frederick-chen/.
Notification of Transmittal of the International Search Report and the Written Opinion of the International Searching Authority, or the Declaration, Date of Mailing Feb. 6, 2023, Applicant's or agent's file reference P202006678, International application No. PCT/EP2022/078303, 9 pages.

\* cited by examiner

STRUCTURE AND METHOD TO PATTERN PITCH LINES

BACKGROUND

The present invention generally relates to the field of pitch lines, and more particularly to forming pitch lines having a pitch equal to or less than 30 nm.

A sub 15 nm pitch back end of the line (BEOL) self-aligned-litho-etch-litho-etch (SALELE) requires reliable sub 30 nm pitch mandrel patterning process which is not available yet. When BEOL pitch becomes less than 13 nm, SALELE will be extremely challenging. The small the scale the number of defects forming in the mandrel increases thus reliably providing mandrels with a pitch equal to or less than 30 nm has not yet been achieved.

BRIEF SUMMARY

Additional aspects and/or advantages will be set forth in part in the description which follows and, in part, will be apparent from the description, or may be learned by practice of the invention.

A semiconductor device comprising a plurality of conductive metal mandrels, wherein the mandrels have a pitch of less than 15 nm, wherein the plurality of conductive mandrels includes a plurality of mandrels having a constant width and a plurality of mandrels having a varied width.

A method comprising forming a plurality of conductive metal mandrels, wherein the mandrels have a pitch of less than 15 nm, wherein the plurality of conductive mandrels includes a plurality of mandrels having a constant width and a plurality of mandrels having a varied width.

A method of semiconductor manufacture comprising forming a multi-layered hard mask on top of a conductive metal layer. Forming a plurality of first mandrels as the top layer of the multi-layered hard mask and forming a first spacer around each of the plurality of first mandrels. Removing the plurality of first mandrels and cutting the first spacer that was located around each of the plurality of first mandrels to form a plurality of second mandrels. Forming a second spacer around each of the plurality of second mandrels and forming a first self-aligned pattern that includes a plurality of third mandrels, wherein the first self-aligned pattern includes a plurality of third mandrels having a constant width and a plurality of third mandrels having a varied width. Removing the plurality of second mandrels and the second spacer and etching the multi-layered hard mask to transfer the first-self aligned pattern to a lower layer of the multi-layered hard mask. Forming a second self-aligned pattern, wherein the second self-aligned pattern is intermixed with the first self-aligned pattern and etching the first self-aligned pattern and the second self-aligned pattern into the conductive metal layer.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (ME), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Self-aligned double patterning (SADP) is a form of double patterning. It is sometimes referred to as pitch division, spacer or sidewall-assisted double patterning. The SADP process uses one lithography step and additional deposition and etch steps to define a spacer-like feature. In the SADP process, the first step is to form mandrels on a substrate, then the pattern is covered with a deposition layer. The deposition layer is then etched, which, in turn, forms spacers. In SADP, the number of cut/block masks may be reduced or even eliminated in dense patches when the spacer is used to directly pattern inter-metal dielectric instead of metal features. The reason is the cut/block locations in the core/mandrel features are already patterned in the first mask. There are secondary features which emerge from the gaps between spacers after further patterning. The edge between a secondary feature and the spacer is self-aligned with the neighboring core feature.

When BEOL pitch becomes less than 13 nm, self-aligned-litho-etch-litho-etch (SALELE) will be extremely challenging. The small the scale the number of defects forming in the mandrel increases thus reliably providing mandrels with a pitch equal to or less than 30 nm has not yet been achieved.

This present invention provides a method to have sub 15 nm pitch BEOL SALELE by forming mandrel with SADP-SALE. This invention provides a structure and method to pattern sub 8 nm lines with SALELE without requiring sub 30 nm pitch mandrel patterning. This invention utilizes SADP step as an intermediate process for sub 15 nm SALELE. Intermediate SADP patterns are removed after a first litho-etch (LE) which make it possible to do SALELE. This invention takes advantage of the tight critical dimension (CD) control of SADP process and design flexibility of SALELE. This invention will require less EUV step than SAQP which requires multiple cut steps.

A method of performing a self-aligned litho-etch (SALE) process, comprising a first set of lines are formed by self-aligned manner along sacrificial SADP patterns and a second set of lines are formed by self-aligned manner along the said first set of lines. In another embodiment, first set of lines are formed by SADP and a second set of lines are formed by self-aligned manner along the said first set of lines.

Figure 1:
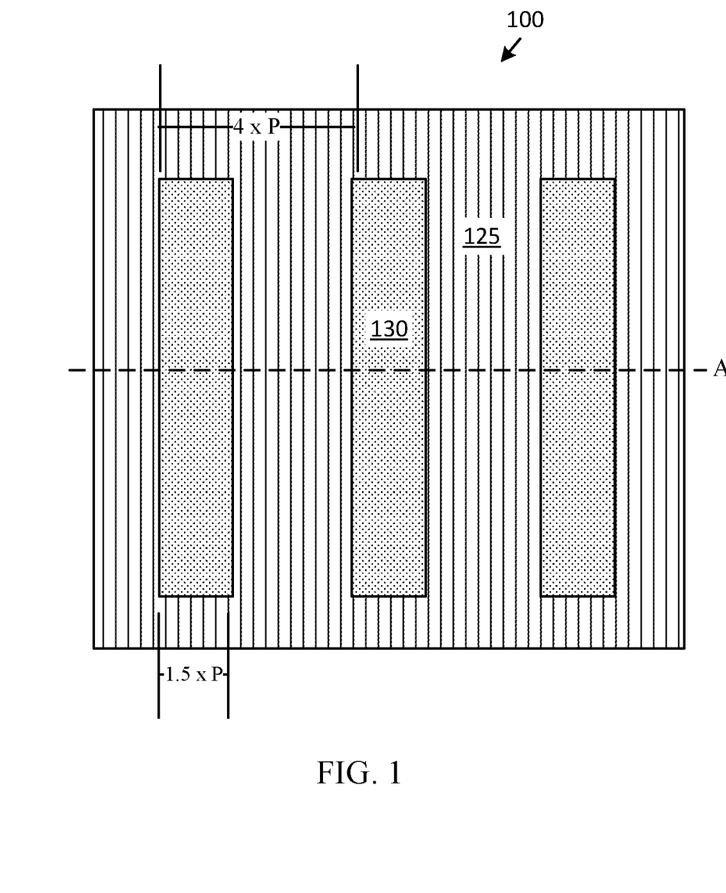
FIG. 1 illustrates a top-down view of the multilayered device, in accordance with an embodiment of the present invention.
Figure 2:
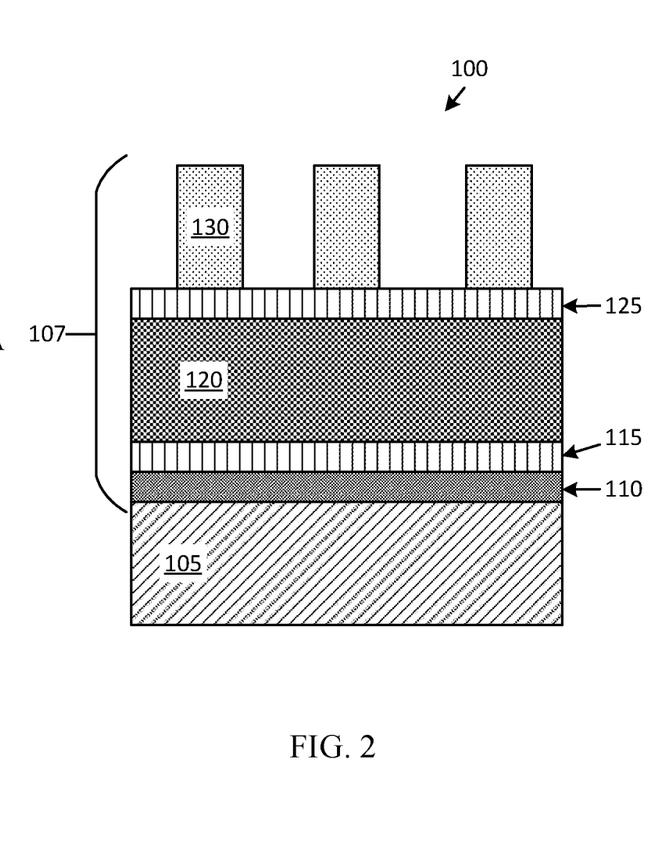
FIG. 2 illustrates cross section A of the multilayered device, in accordance with the embodiment of the present invention.

FIG. 1 illustrates a top-down view of the multilayered device 100, in accordance with an embodiment of the present invention. FIG. 2 illustrates cross section A of the multilayered device 100, in accordance with the embodiment of the present invention. The multilayered device 100 includes first layer 105 and a hard mask 107. The first layer 105 can be comprised of, for example, Ru, Cu, or another conductive metal. The hard mask 107 is comprised of multiple layers, such that the hard mask 107 includes a second layer 110, a third layer 115, a fourth layer 120, a fifth layer 125, a plurality of first mandrels 130. The second layer 110 can be comprised of, for example, TiN. The third layer 115 can be comprised of, for example, amorphous-Si. The fourth layer 120 can be comprised of, for example, SiN. The fifth layer 125 can be comprised of, for example, amorphous-Si. The plurality of first mandrels 130 can be comprised of, for example, SiN. The plurality of the plurality of first mandrels 130 have a pitch (i.e., the distance from the left side of a first mandrel to the left side of the adjacent first mandrel) of 4*P, where P is the desired pitch for the final design of the device. Each of the plurality of first mandrels 130 have a width 1.5*P. By utilizing a multilayered hard mask 107 allows for the design to be progressively formed within in the hard mask 107 prior to being transferred to the first layer 105.

Figure 3:
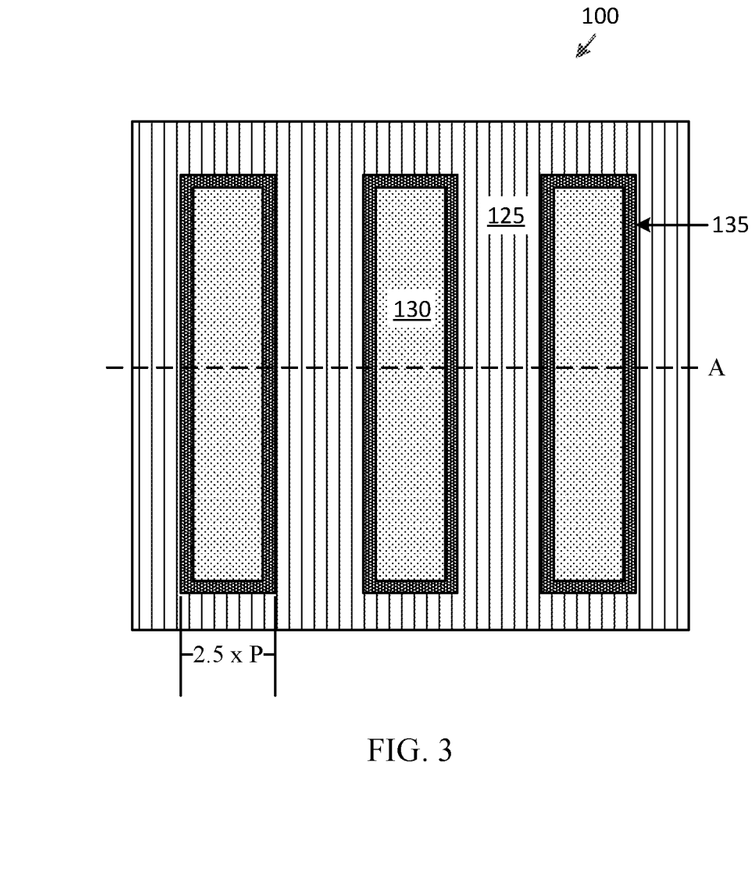
FIG. 3 illustrates a top-down view of the multilayered device after formation of a spacer around the first mandrels, in accordance with an embodiment of the present invention.
Figure 4:
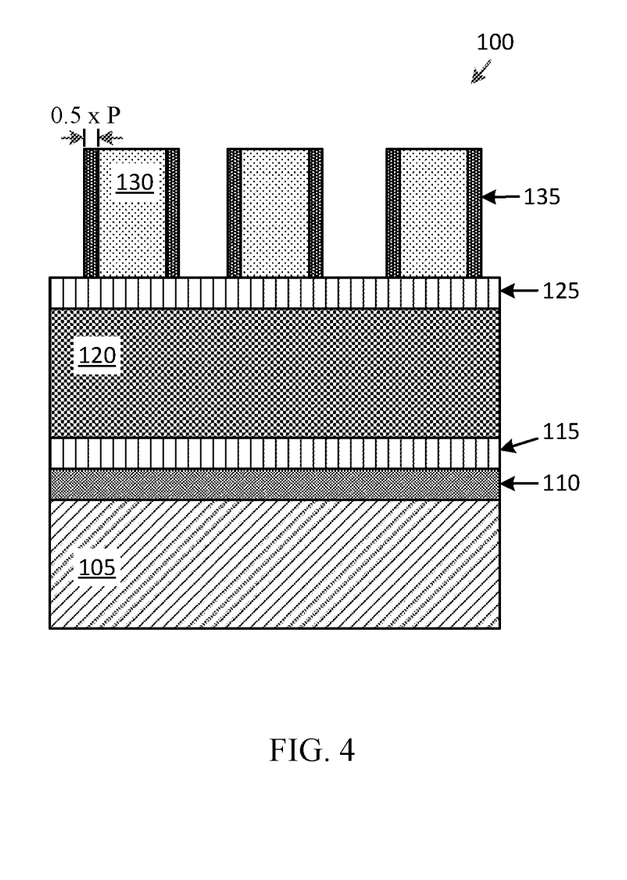
FIG. 4 illustrates cross section A of the multilayered device after formation of a spacer around the first mandrels, in accordance with the embodiment of the present invention.

FIG. 3 illustrates a top-down view of the multilayered device 100 after formation of a first spacer 135 around the first mandrels 130, in accordance with an embodiment of the present invention. FIG. 4 illustrates cross section A of the multilayered device 100 after formation of a first spacer 135 around the first mandrels 130, in accordance with the embodiment of the present invention. A first spacer 135 is formed on the top surface of the fifth layer 125 and on the exposed surfaces of the first mandrels 130. The first spacer 135 is etched back so that the first spacer 135 is located on the side walls of the plurality of first mandrels 130. The first spacer 135 can be comprised of, for example, TiN.

Figure 5:
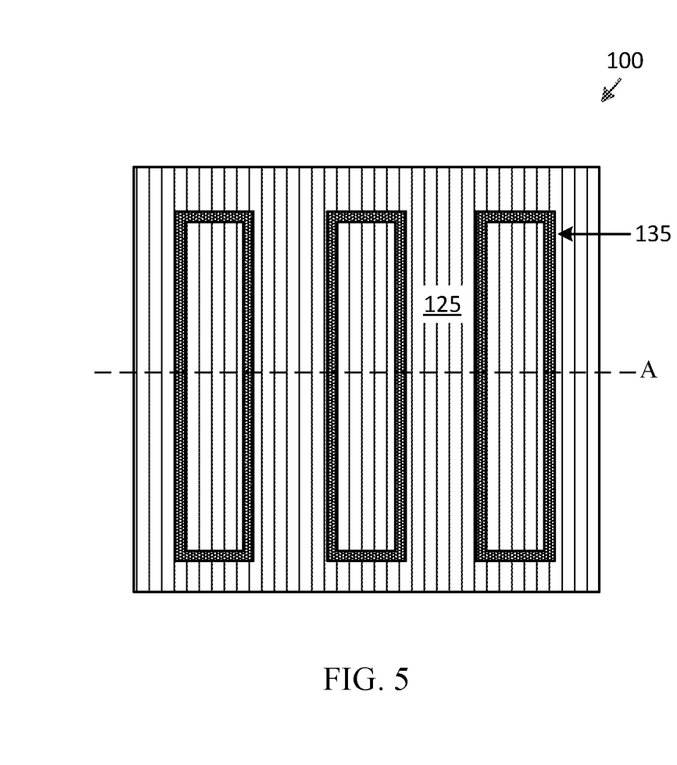
FIG. 5 illustrates a top-down view of the multilayered device after the removal of the first mandrels, in accordance with an embodiment of the present invention.
Figure 6:
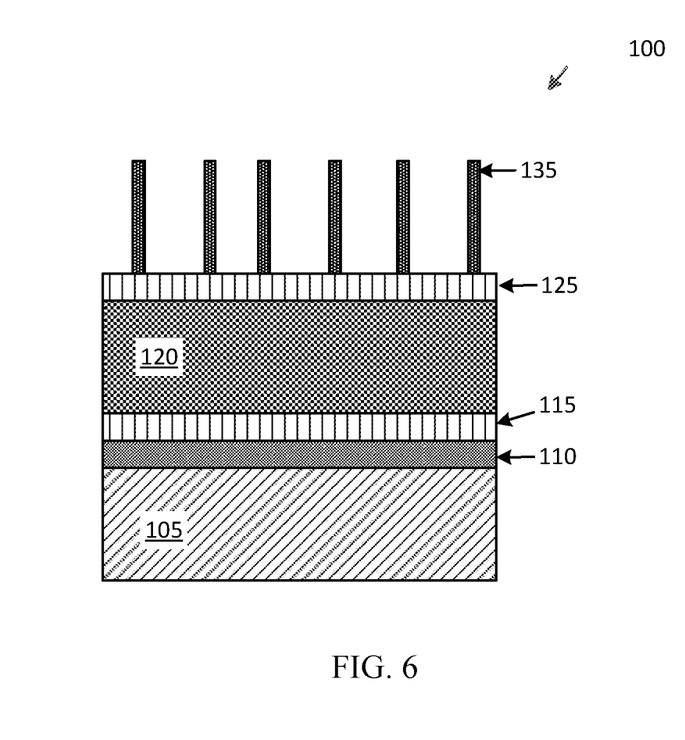
FIG. 6 illustrates cross section A of the multilayered device after removal of the first mandrels, in accordance with the embodiment of the present invention.

FIG. 5 illustrates a top-down view of the multilayered device 100 after the removal of the first mandrels 130, in accordance with an embodiment of the present invention. FIG. 6 illustrates cross section A of the multilayered device 100 after removal of the first mandrels 130, in accordance with the embodiment of the present invention. The first mandrels 130 are removed without the removal of the first spacer 135. A trench is formed in the location of the plurality of first mandrels 130 caused by the removal of the plurality of first mandrels 130.

Figure 7:
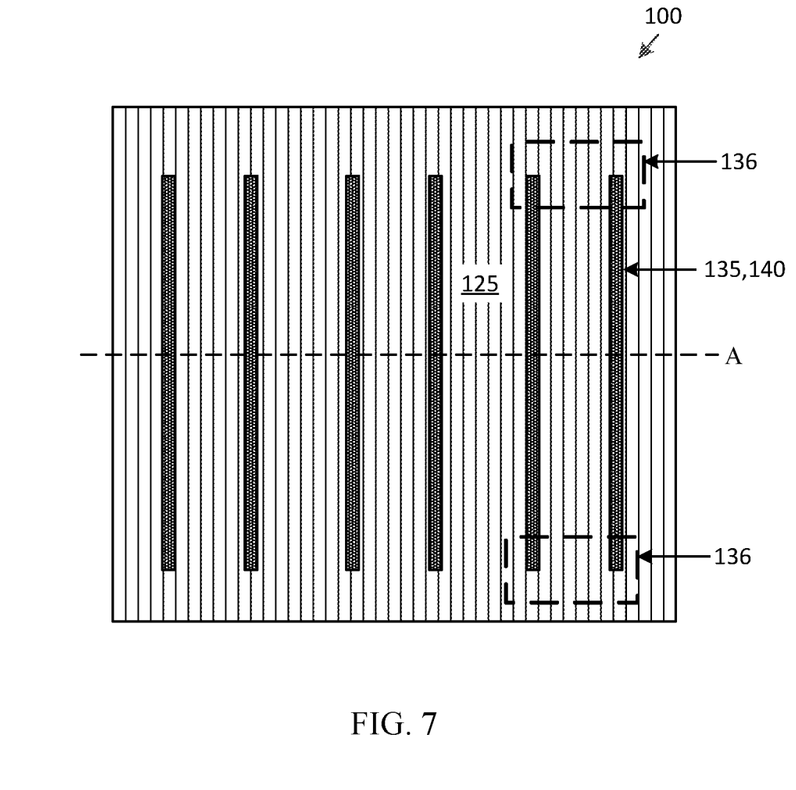
FIG. 7 illustrates a top-down view of the multilayered device after the removal of a portion of the spacer, in accordance with an embodiment of the present invention.
Figure 8:
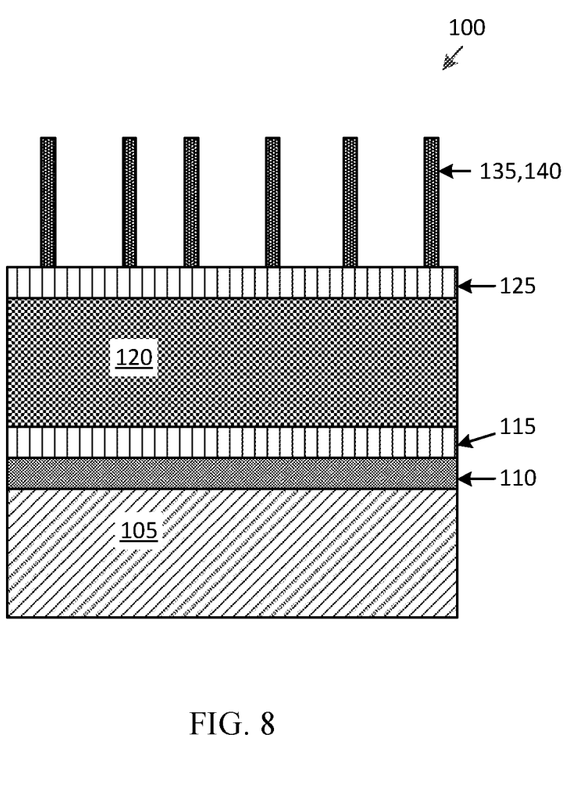
FIG. 8 illustrates cross section A of the multilayered device after removal of a portion of the spacer, in accordance with the embodiment of the present invention.

FIG. 7 illustrates a top-down view of the multilayered device 100 after the removal of a portion of the first spacer 135, in accordance with an embodiment of the present invention. FIG. 8 illustrates cross section A of the multilayered device 100 after removal of a portion of the first spacer 135, in accordance with the embodiment of the present invention. The first spacer 135 is formed as one continuous element around each of the plurality of first mandrels 130.

A portion of the each of the first spacer 135 can be removed so that each of the first spacer 135 is no longer one single element. As illustrated by FIG. 5, each end of first spacer 135 is removed as illustrated by dashed box 136, causing the formation of a plurality of second mandrels 140. The number of plurality of second mandrels 140 is double the number of plurality of first mandrels 130.

Figure 9:
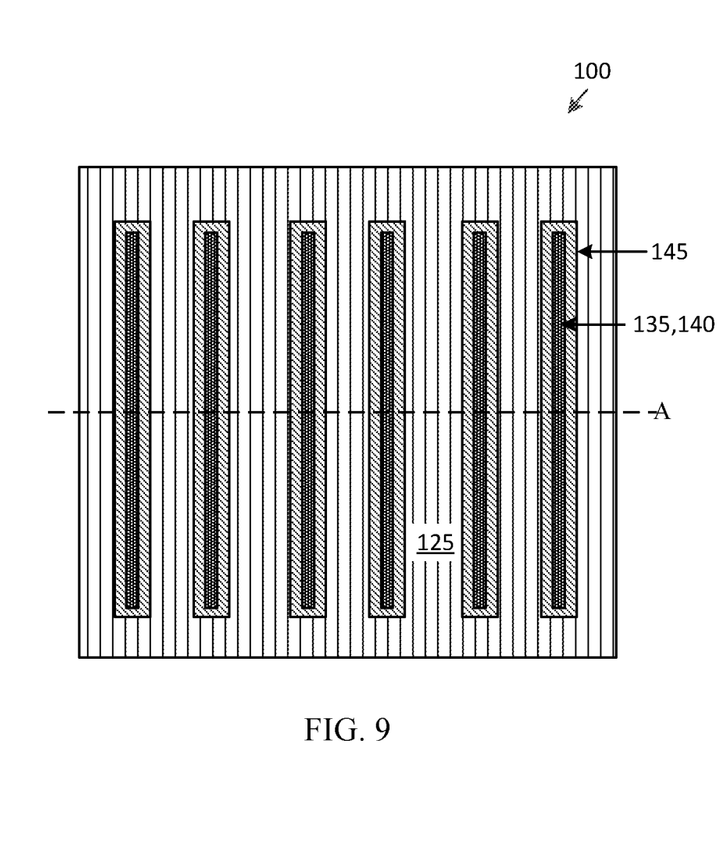
FIG. 9 illustrates a top-down view of the multilayered device after the formation of a second spacer, in accordance with an embodiment of the present invention.
Figure 10:
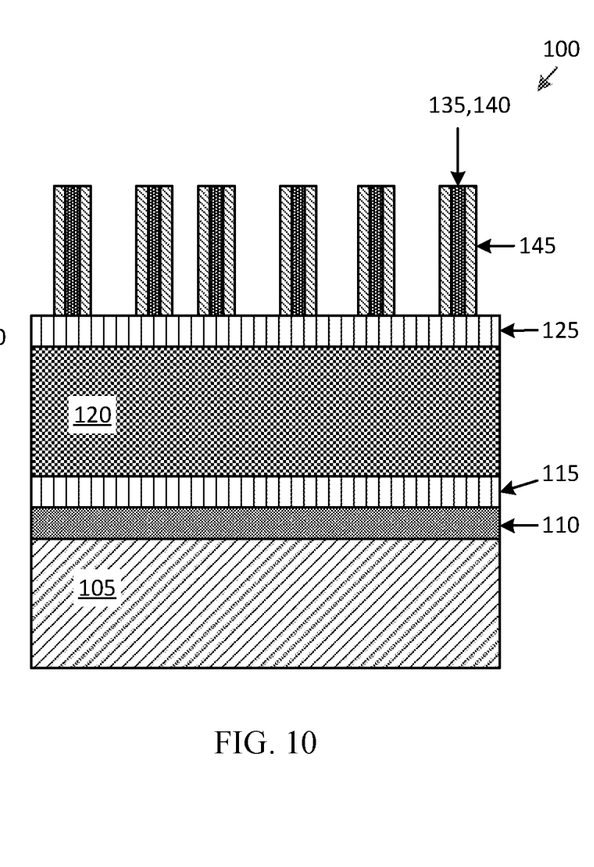
FIG. 10 illustrates cross section A of the multilayered device after formation of the spacer, in accordance with the embodiment of the present invention.

FIG. 9 illustrates a top-down view of the multilayered device 100 after the formation of a second spacer 145, in accordance with an embodiment of the present invention. FIG. 10 illustrates cross section A of the multilayered device 100 after formation of the spacer 145, in accordance with the embodiment of the present invention. A second spacer 145 is formed on the top surface of the fifth layer 125 and on the exposed surfaces of each of the plurality of second mandrels 140. The second spacer 145 is etched back so that the second spacer 145 is only located on the side walls of each of the plurality of second mandrels 140. The second spacer 145 can be comprised of, for example, $TiO_x$. The material used for the first spacer/second mandrels 135, 140 needs to be different than the material used for the second spacer 145.

Figure 11:
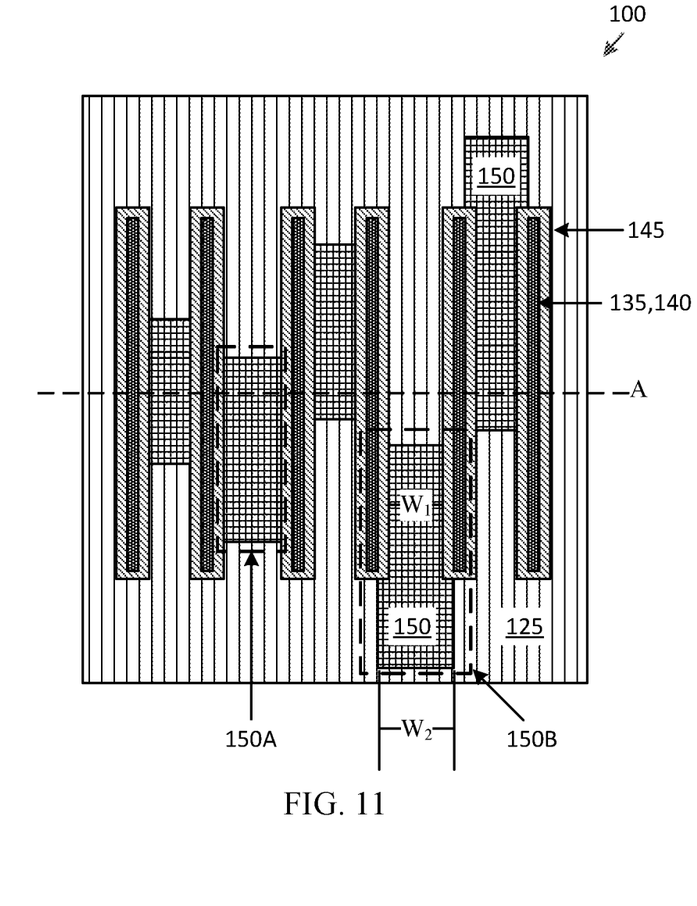
FIG. 11 illustrates a top-down view of the multilayered device after the formation of a first pattern, in accordance with an embodiment of the present invention.
Figure 12:
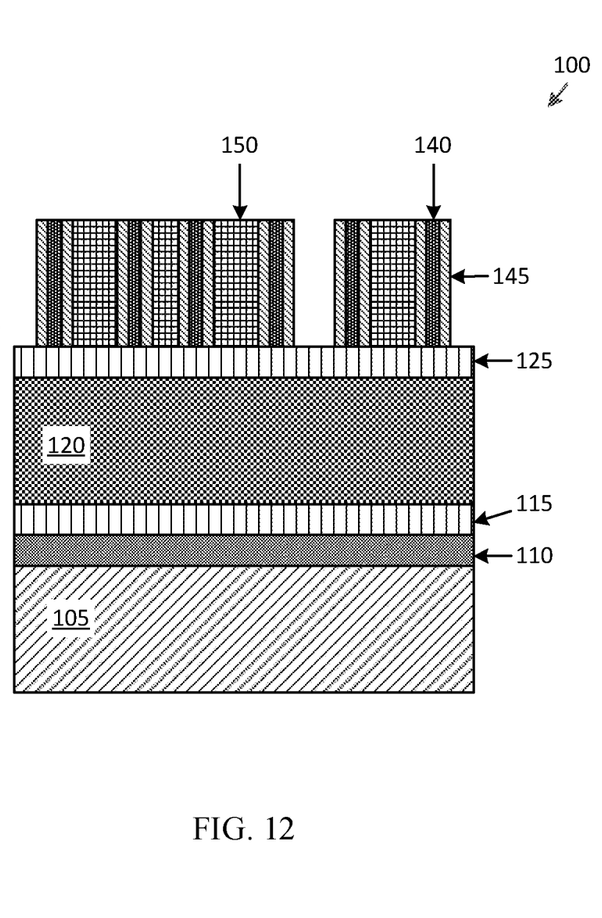
FIG. 12 illustrates cross section A of the multilayered device after formation of the first pattern, in accordance with the embodiment of the present invention.

FIG. 11 illustrates a top-down view of the multilayered device 100 after the formation of a first pattern, in accordance with an embodiment of the present invention. FIG. 12 illustrates cross section A of the multilayered device 100 after formation of the first pattern, in accordance with the embodiment of the present invention. A first pattern of third mandrels 150 is formed on top of the fifth layer 125 and located around the second spacer 145, by depositing a material and etching the material back to the desired pattern. The third mandrels 150 can be comprised of, for example, SOG. The third mandrels 150 can have a varied of design formation that allows for the design flexibility. For example, the third mandrels 150 can have straight mandrels with a constant width, (as illustrated by dashed box 150A) and the third mandrels 150 can have mandrels where the width is varied in different sections of the third mandrel (as illustrated by dashed box 150B). The third mandrel 150 that has a varied width can have a first section that has a first width $W_1$ and a second section having a width $W_2$, where $W_2$ is greater than $W_1$. For example, $W_2$ can be two times greater than $W_1$. $W_2$ can be in the range of about 2× to 5× greater than $W_1$.

Figure 13:
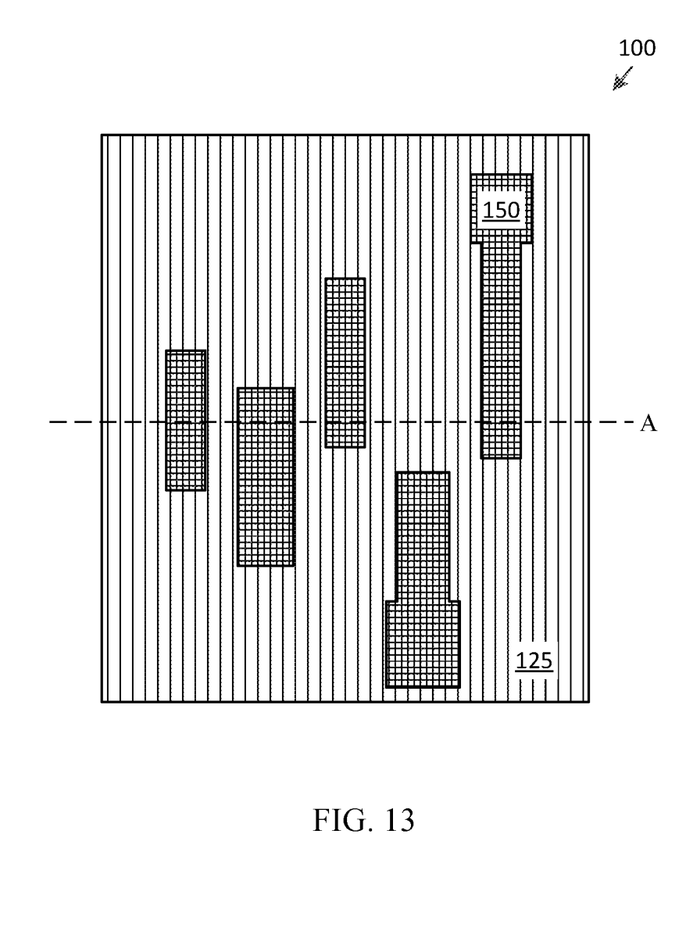
FIG. 13 illustrates a top-down view of the multilayered device after removal of the second mandrel and the second spacer, in accordance with an embodiment of the present invention.
Figure 14:
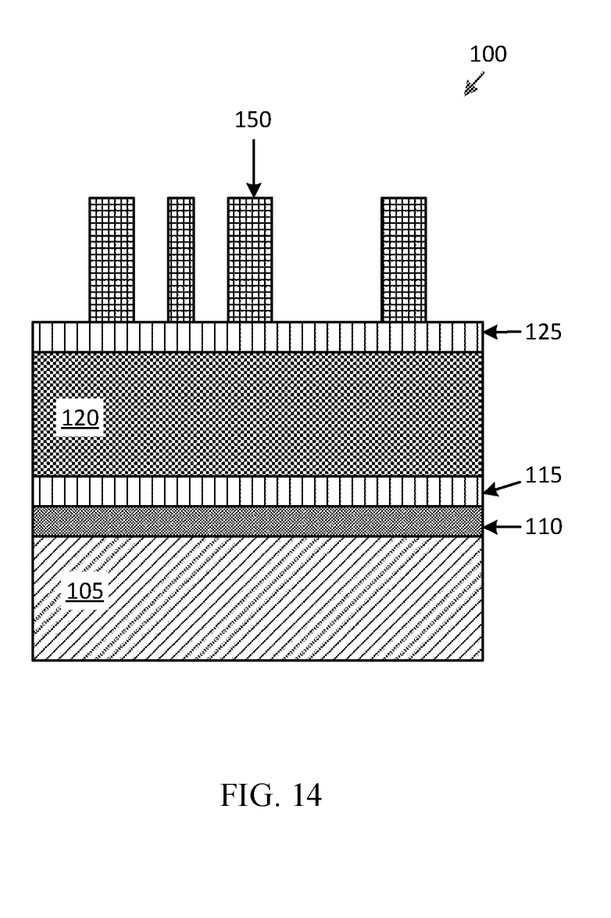
FIG. 14 illustrates cross section A of the multilayered device after removal of the second mandrel and the second spacer, in accordance with the embodiment of the present invention.

FIG. 13 illustrates a top-down view of the multilayered device 100 after removal of the second mandrel 140 and the second spacer 145, in accordance with an embodiment of the present invention. FIG. 14 illustrates cross section A of the multilayered device 100 after removal of the second mandrel 140 and the second spacer 145, in accordance with the embodiment of the present invention. The second mandrel 140 and the second spacer 145 are removed, while the third mandrel 150 remains located on top of the fifth layer 125.

Figure 15:
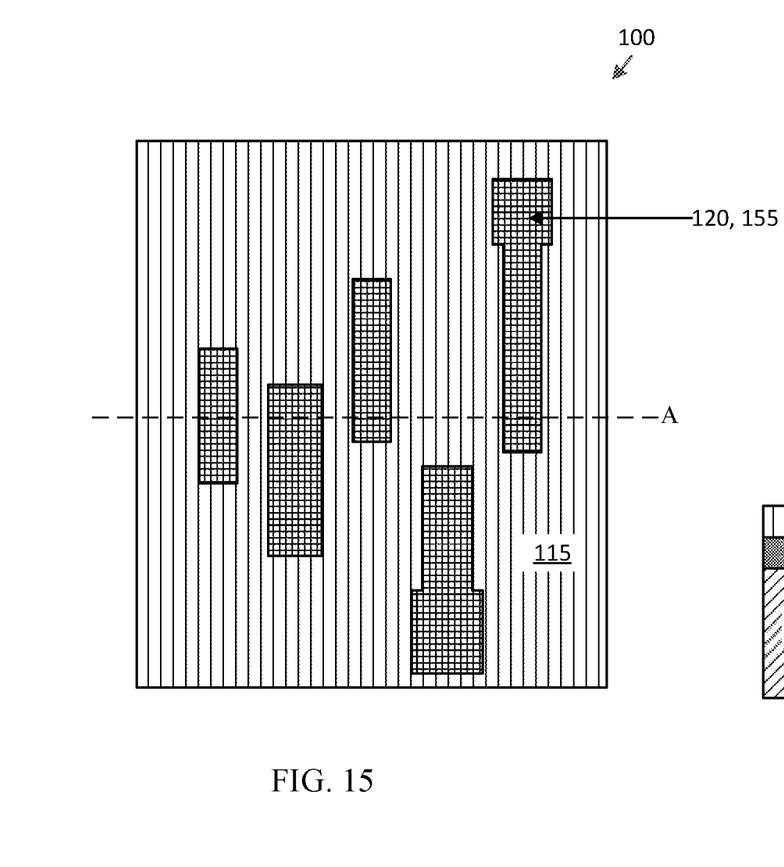
FIG. 15 illustrates a top-down view of the multilayered device after transferring the first pattern into the fourth layer, in accordance with an embodiment of the present invention.
Figure 16:
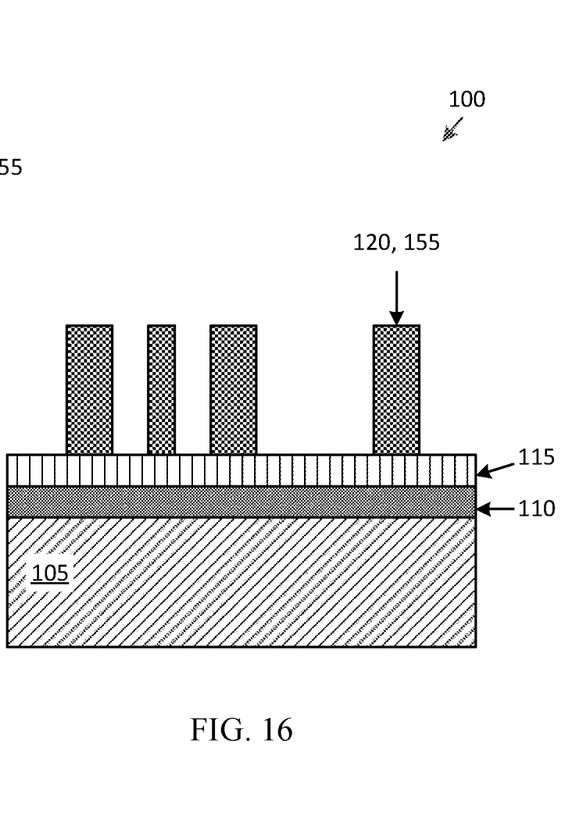
FIG. 16 illustrates cross section A of the multilayered device after transferring the first pattern into the fourth layer, in accordance with the embodiment of the present invention.

FIG. 15 illustrates a top-down view of the multilayered device 100 after transferring the first pattern into the fourth layer 120, in accordance with an embodiment of the present invention. FIG. 16 illustrates cross section A of the multilayered device 100 after transferring the first pattern into the fourth layer 120, in accordance with the embodiment of the present invention. The pattern of the third mandrels 150 is transferred to the fourth layer 120 by etching the fifth layer 125 and the fourth layer 120, respectively, to transfer the pattern. The pattern in the fourth layer 120 creates the fourth mandrels 155, where the pattern of the fourth mandrels 155 matches the pattern of the third mandrels 150.

Figure 17:
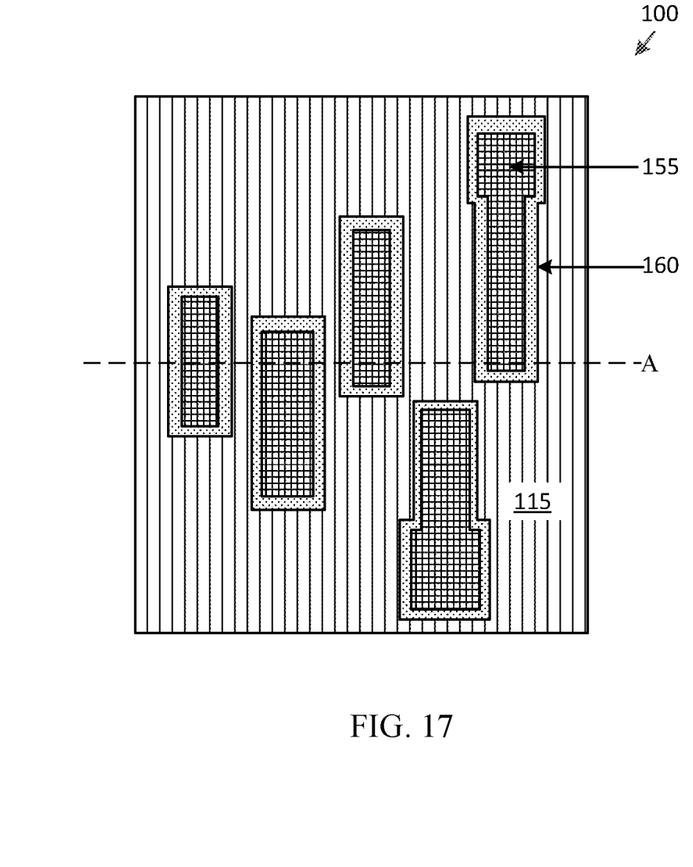
FIG. 17 illustrates a top-down view of the multilayered device after formation of a third spacer, in accordance with an embodiment of the present invention.
Figure 18:
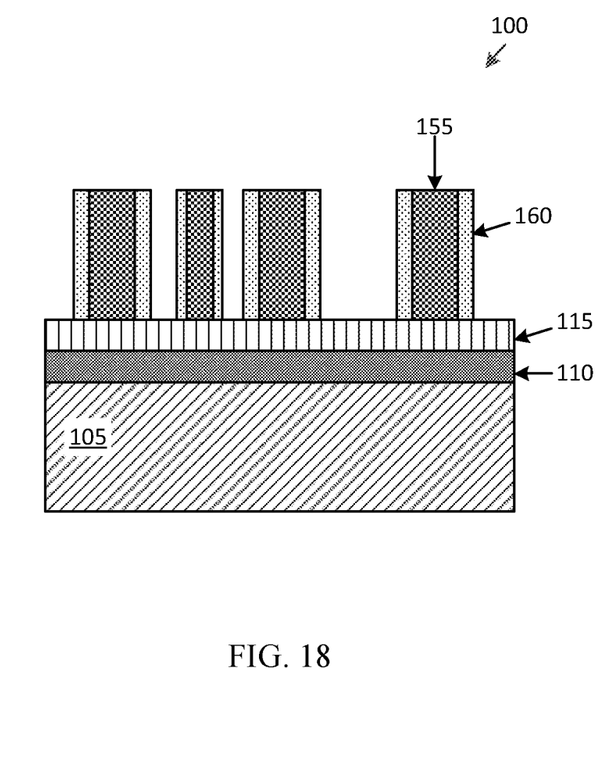
FIG. 18 illustrates cross section A of the multilayered device after formation of the third spacer, in accordance with the embodiment of the present invention.

FIG. 17 illustrates a top-down view of the multilayered device 100 after formation of a third spacer 160, in accordance with an embodiment of the present invention. FIG. 18 illustrates cross section A of the multilayered device 100 after formation of the third spacer 160, in accordance with the embodiment of the present invention. A third spacer 160 is formed on the top surface of the third layer 115 and on the exposed surfaces of the fourth mandrels 155. The third spacer 160 is etched back so that the third spacer 160 is located on the side walls of the fourth mandrels 155. The third spacer 160 can be comprised of, for example, TiN.

Figure 19:
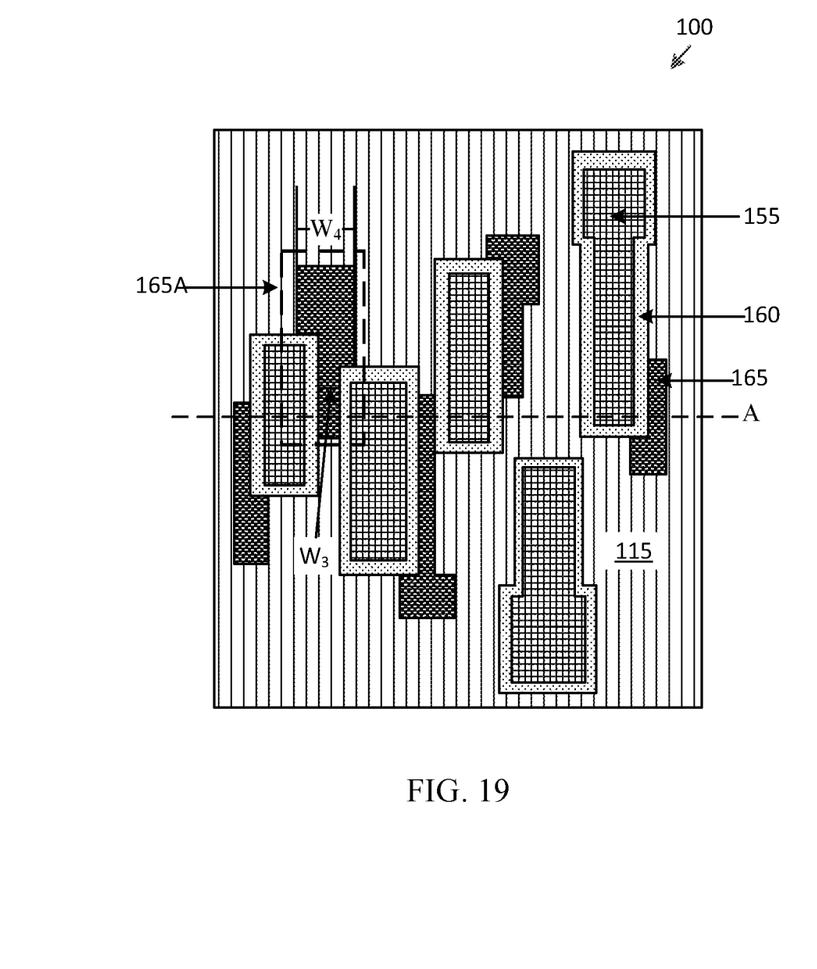
FIG. 19 illustrates a top-down view of the multilayered device after formation of a second pattern, in accordance with an embodiment of the present invention.
Figure 20:
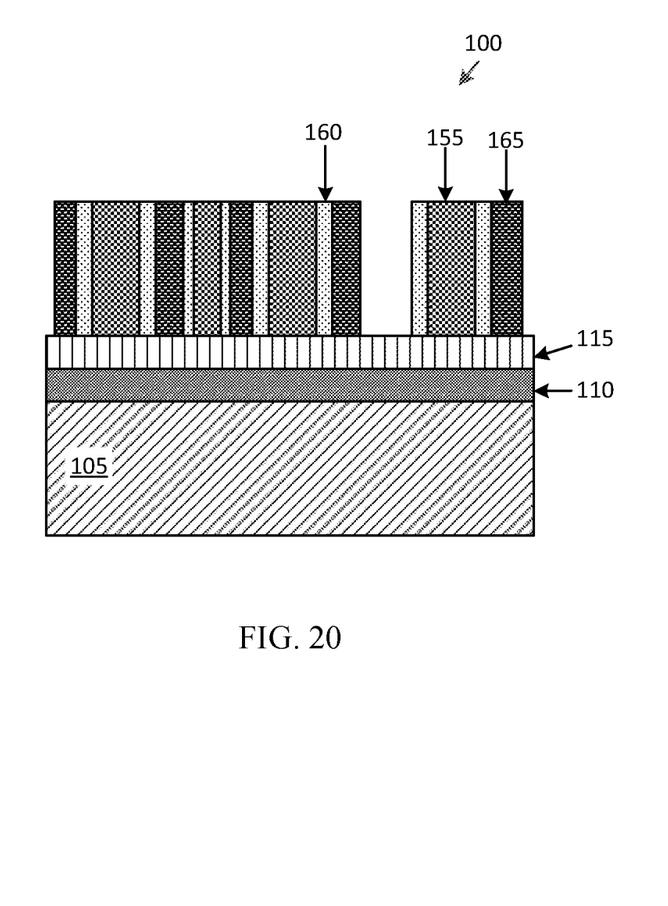
FIG. 20 illustrates cross section A of the multilayered device after formation of a second pattern, in accordance with the embodiment of the present invention.

FIG. 19 illustrates a top-down view of the multilayered device 100 after formation of a second pattern, in accordance with an embodiment of the present invention. FIG. 20 illustrates cross section A of the multilayered device 100 after formation of a second pattern, in accordance with the embodiment of the present invention. A second pattern of fifth mandrels 165 is formed on top of the third layer 115 and located around the third spacer 160, by depositing a material and etching the material back to the desired pattern. The second pattern of fifth mandrels 165 can be formed adjacent to or intermixed with the pattern of fourth mandrels 155. The fifth mandrels 165 can be comprised of, for example, SOG. The fifth mandrels 165 can have a varied of design formation that allows for the design flexibility. For example, the fifth mandrels 165 can have straight mandrels with a constant width, (not shown) and the fifth mandrels 165 can have mandrels where the width is varied in different sections of the fifth mandrel (as illustrated by dashed box 165A). The fifth mandrels 165 that has a varied width can have a first section that has a first width $W_3$ and a second section having a width $W_4$, where $W_4$ is greater than $W_3$. For example, $W_4$ can be two times greater than $W_3$. $W_4$ can be in the range of about 2× to 5× greater than $W_3$. The combined pattern of the fifth mandrels 165 and the fourth mandrels 155 will be the final design pattern for the final design to be transferred to the first layer 105.

Figure 21:
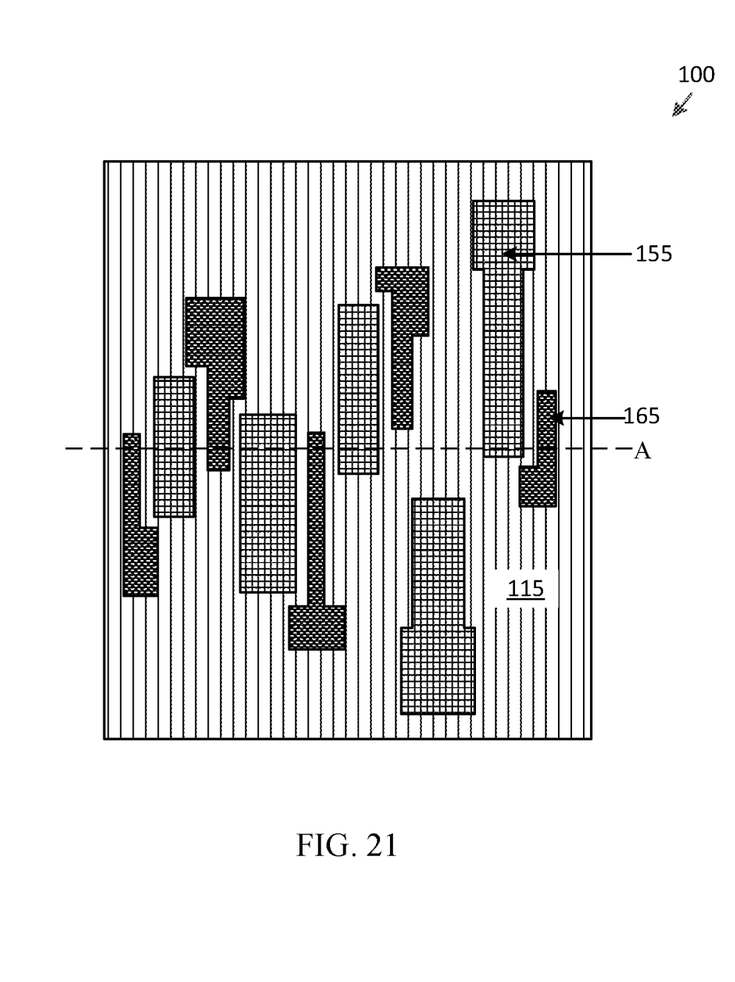
FIG. 21 illustrates a top-down view of the multilayered device after removal third spacer, in accordance with an embodiment of the present invention.
Figure 22:
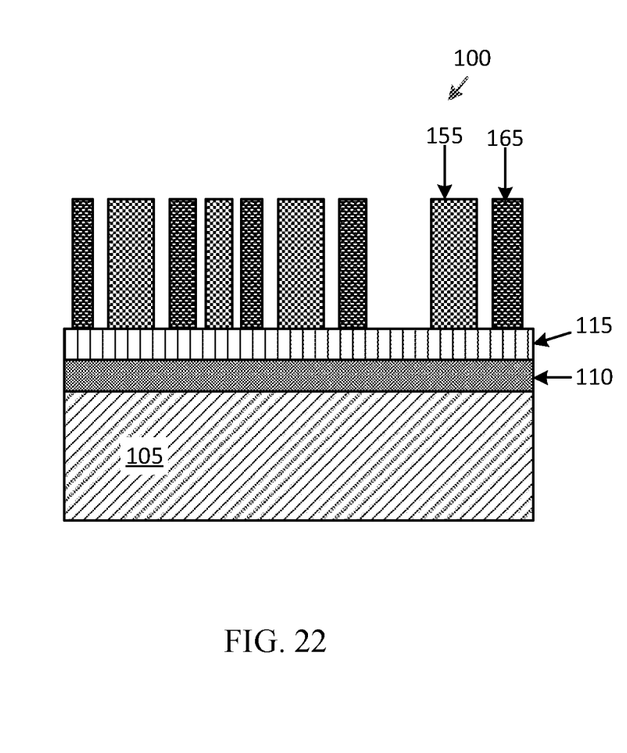
FIG. 22 illustrates cross section A of the multilayered device after removal of the third spacer, in accordance with the embodiment of the present invention.

FIG. 21 illustrates a top-down view of the multilayered device 100 after removal third spacer 160, in accordance with an embodiment of the present invention. FIG. 22 illustrates cross section A of the multilayered device 100 after removal of the third spacer 160, in accordance with the embodiment of the present invention. The third spacer 160 is removed while the fourth mandrels 155 and the fifth mandrels 165 remain. The removal of the third spacer 160 allows for the formation of spacing between the fifth mandrels 165 and the fourth mandrels 155.

Figures 23, 24:
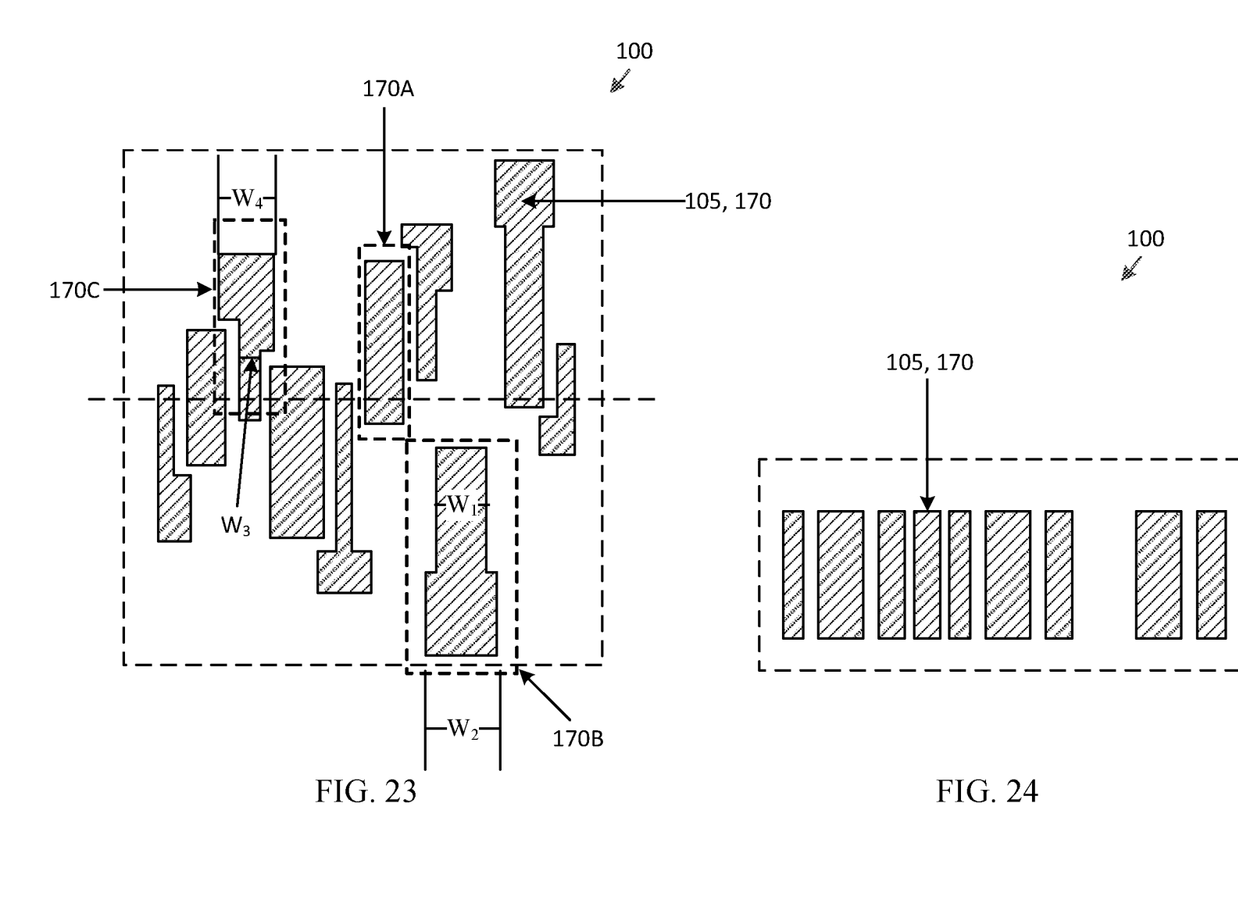
FIG. 23 illustrates a top-down view of the multilayered device after transferring into the pattern into the first layer, in accordance with an embodiment of the present invention.
FIG. 24 illustrates cross section A of the multilayered device after transferring into the pattern into the first layer, in accordance with the embodiment of the present invention.

FIG. 23 illustrates a top-down view of the multilayered device 100 after transferring into the pattern into the first layer 105, in accordance with an embodiment of the present invention. FIG. 24 illustrates cross section A of the multilayered device 100 after transferring into the pattern into the first layer 105, in accordance with the embodiment of the present invention. The pattern of the fourth mandrels 155 and the pattern of the fifth mandrels 165 are transferred to the first layer 105 by etching the third layer 115, the second layer 110, and the first layer 105, respectively, to transfer the pattern. The pattern in the first layer 105 creates the sixth mandrels 170, where the pattern of the sixth mandrels 170 matches the fourth mandrels 155 and the fifth mandrels 165. For example, the sixth mandrels 170 can have straight mandrels with a constant width, (as illustrated by dashed box 170A) and the sixth mandrels 170 can have mandrels where the width is varied in different sections of the sixth mandrels 170 (as illustrated by dashed box 170B and 170C). The sixth mandrel 170 located in dash box 170B corresponds to the design of the third mandrels 150. The sixth mandrel 170 located in dash box 170C corresponds to the design of the fifth mandrels 165. The overall pattern of the sixth mandrels 170 is the combined pattern of the third mandrels 150 and the fifth mandrels 165. The proposed invention allows for the formation of sixth mandrels 170 having a pitch of less than 15 nm.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method of semiconductor manufacture comprising:
    forming a multi-layered hard mask on top of a conductive metal layer;
    forming a plurality of first mandrels as a top layer of the multi-layered hard mask;
    forming a first spacer around each of the plurality of first mandrels;
    removing the plurality of first mandrels;
    cutting the first spacer that was located around each of the plurality of first mandrels to form a plurality of second mandrels;
    forming a second spacer around each of the plurality of second mandrels;
    forming a first self-aligned pattern that includes a plurality of third mandrels, wherein the first self-aligned pattern includes a plurality of third mandrels having a constant width and a plurality of third mandrels having a varied width;
    removing the plurality of second mandrels and the second spacer;
    etching the multi-layered hard mask to transfer the first-self aligned pattern to a lower layer of the multi-layered hard mask;
    forming a second self-aligned pattern, wherein the second self-aligned pattern is intermixed with the first self-aligned pattern; and
    etching the first self-aligned pattern and the second self-aligned pattern into the conductive metal layer.

2. The method of claim 1, wherein each third mandrel of the plurality of third mandrels having the varied width, has a first section having a first width and a second section having a second width, wherein the first width and the second width are different, wherein the first section can be located horizontally or vertically adjacent to the second section.

3. The method of claim 2, wherein the second width is two times greater than the first width.

4. The method of claim 3, wherein the second width is in a range of two times to 5 times greater than the first width.

5. The method of claim 1, wherein the etching the multi-layered hard mask to transfer the first-self aligned pattern to the lower layer of the multi-layered hard mask cause a formation of a plurality of fourth mandrels to be formed in the lower layer in a pattern of the first self-aligned pattern.

6. The method of claim 5, further comprising:
    forming a third spacer around the plurality of fourth mandrels.

7. The method of claim 6, wherein the forming of the second self-aligned pattern comprises:
    forming a plurality of fifth mandrels adjacent to the third spacer, wherein the plurality of fifth mandrels is intermixed with the plurality of fourth mandrels, wherein the plurality of fifth mandrels includes a plurality of fifth mandrels having a constant width and a plurality of fifth mandrels having a varied width.

8. The method of claim 7, wherein each fifth mandrel of the plurality of fifth mandrels having the varied width, has a first section having a first width and a second section having a second width, wherein the first width and the second width are different.

9. The method of claim 8, wherein the second width is two times greater than the first width.

10. The method of claim 9, wherein the second width is in a range of two times to 5 times greater than the first width.

11. The method of claim 8, further comprising:
    removing the third spacer.

* * * * *